(12) United States Patent
Song

(10) Patent No.: US 8,446,793 B2
(45) Date of Patent: May 21, 2013

(54) SEMICONDUCTOR MEMORY DEVICE INCLUDING CLOCK CONTROL CIRCUIT AND METHOD FOR OPERATING THE SAME

(75) Inventor: Choung-Ki Song, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 131 days.

(21) Appl. No.: 12/981,723

(22) Filed: Dec. 30, 2010

(65) Prior Publication Data

US 2011/0242923 A1    Oct. 6, 2011

(30) Foreign Application Priority Data

Mar. 31, 2010 (KR) .......................... 10-2010-0029592
Dec. 29, 2010 (KR) .......................... 10-2010-0137434

(51) Int. Cl.
*G11C 7/00* (2006.01)
(52) U.S. Cl.
USPC ....................... 365/222; 365/233.11; 365/219
(58) Field of Classification Search
USPC ..................... 365/222, 291, 233.11
See application file for complete search history.

(56) References Cited

U.S. PATENT DOCUMENTS

| | | | | |
|---|---|---|---|---|
| 6,545,938 B2 * | 4/2003 | Lee et al. | ................. | 365/230.08 |
| 6,912,169 B2 * | 6/2005 | Choi | ............................ | 365/222 |
| 6,961,278 B2 * | 11/2005 | Jeong | ............................ | 365/222 |
| 6,990,032 B2 * | 1/2006 | Jang | ............................ | 365/222 |
| 7,212,461 B2 * | 5/2007 | Kim et al. | ..................... | 365/222 |

FOREIGN PATENT DOCUMENTS

| | | |
|---|---|---|
| KR | 1020010057488 | 7/2001 |
| KR | 1020040102727 | 12/2004 |
| KR | 1020050036881 | 4/2005 |
| KR | 100623601 | 9/2006 |

OTHER PUBLICATIONS

Notice of Allowance issued by the Korean Intellectual Property Office on Jan. 17, 2013.

* cited by examiner

*Primary Examiner* — Pho M Luu
(74) *Attorney, Agent, or Firm* — IP & T Group LLP

(57) ABSTRACT

A clock control circuit includes a first clock buffer configured to toggle a first clock signal when a self-refresh exit command signal is inputted during a self-refresh operation; and a second clock buffer configured to toggle a second clock signal when the self-refresh operation is finished, the second clock being provided to internal circuits.

19 Claims, 5 Drawing Sheets

SEMICONDUCTOR MEMORY DEVICE INCLUDING CLOCK CONTROL CIRCUIT AND METHOD FOR OPERATING THE SAME

CROSS-REFERENCES TO RELATED APPLICATIONS

The present application claims priority of Korean Patent Application Nos. 10-2010-0029592 and 10-2010-0137434, filed on Mar. 31, 2010, and Dec. 29, 2010, respectively, which are incorporated herein by reference in their entirety.

BACKGROUND OF THE INVENTION

Exemplary embodiments of the present invention relate to a clock control circuit for synchronization control of a semiconductor memory device, and a method for operating a semiconductor memory device including a clock control circuit.

For a high speed operation, a semiconductor memory device is designed to receive an external clock signal and process commands and data in synchronization with the external clock signal. The external clock signal inputted to the semiconductor memory device is one of the main factors contributing to power dissipation because it is always toggling under operation conditions of the semiconductor memory device.

FIGS. 1 and 2 are diagrams of a clock control circuit which is used in a known semiconductor memory device.

As shown, the known clock control circuit includes a first clock buffer 14 of FIG. 1 and a second clock buffer 28 of FIG. 2. When a first clock buffer enable signal CLKBUF1_EN is activated to a logic high level, the first clock buffer 14 converts clock signals CLK and CLKB to generate first internal clock signals ICLK2F and ICLK2. When a second clock buffer enable signal CLKBUF2_EN is activated to a logic high level, the second clock buffer 28 converts the clock signals CLK and CLKB to generate second internal clock signals CVR_CLK2 and CVR_CLK1B.

The first clock buffer enable signal CLKBUF1_EN for controlling the first clock buffer 14 transitions to a logic high level when a valid self-refresh operation signal SREF_FASTB is at a logic high level and an inverted external reset signal RSTB is at a logic high level. Here, the valid self-refresh operation signal SREF_FASTB is activated in response to an input timing of an external self-refresh start command signal SREF_CMD, and deactivated in response to an input timing of an external self-refresh exit command signal EXIT_CMD.

The first clock buffer 14 generates the first internal clock signals ICLK2F and ICLK2 by converting the clock signals CLK and CLKB in response to the high-level first clock buffer enable signal CLKBUF1_EN. Except for a self-refresh period, the first internal clock signals ICLK2F and ICLK2 are always toggling and are provided to control a specific internal block 10 and a self-refresh signal generation unit 20. Therefore, when the semiconductor memory device is operating, the first clock buffer 14 always consumes an electric current during the toggling operation. For reference, the specific internal block 10 may include an On Die Termination (ODT) block and a delay locked loop (DLL) circuit, which are activated in advance prior to a main operation of the semiconductor memory device.

The clock buffer enable signal CLKBUF2_EN for controlling the second clock buffer 28 transitions to a logic high level when both an internal self-refresh signal SREF and a power-down signal PWR_DN are at a logic low level and the inverted external reset signal RSTB is at a logic high level. Here, the internal self-refresh signal SREF is activated to a logic high level for a period where a substantial self-refresh operation is performed, and the power-down signal PWR_DN is activated to a logic high level for a power-down mode of the semiconductor memory device.

The second clock buffer 28 generates the second internal clock signals CVR_CLK2 and CVR_CLK1B by converting the clock signals CLK and CLKB in response to the high-level second clock buffer enable signal CLKBUF2_EN. Except for the self-refresh period, the second internal clock signals CVR_CLK2 and CVR_CLK1B are always toggling and are provided to control a plurality of internal blocks 30 to 36. Therefore, when the semiconductor memory device is operating, the second clock buffer 28 also always consumes an electric current during the toggling operation. For reference, the internal blocks 30 to 36 may include a command decoding unit which is activated for the main operation of the semiconductor memory device.

Hereinafter, referring to FIGS. 1 and 2, an operation of the clock control circuit of a known semiconductor memory device is described below.

FIG. 3 is a timing diagram depicting a case where an internal operation of the semiconductor memory device is in an idle state after a self-refresh control operation is completed.

Referring to FIG. 3, when the self-refresh start command signal SREF_CMD is input, a clock enable signal CKE and the idle signal IDLE are deactivated to a logic low level, the valid self-refresh operation signal SREF_FASTB is activated to a logic low level, and the internal self-refresh signal SREF is activated to a logic high level. In response to the low-level valid self-refresh operation signal SREF_FASTB, the first clock buffer enable signal CLKBUF1_EN is deactivated to a logic low level, and thus the first clock buffer 14 stops a toggling of the first internal clock signal ICLK2. Meanwhile, in response to the high-level internal self-refresh signal SREF, the second clock buffer enable signal CLKBUF2_EN is deactivated to a logic low level, and thus the second clock buffer 28 stops a toggling of the second internal clock signal CVR_CLK2.

After an internal self-refresh operation is performed, the self-refresh exit command signal EXIT_CMD is input. In response to the self-refresh exit command signal EXIT_CMD, the clock enable signal CKE is activated to a logic high level and the valid self-refresh operation signal SREF_FASTB is deactivated to a logic high level. At this time, the idle signal IDLE becomes a logic high level since there are no low-active banks among internal banks of the semiconductor memory device. In response to the high-level valid self-refresh operation signal SREF_FASTB, the first clock buffer enable signal CLKBUF1_EN is activated to a logic high level, and thus the first clock buffer 14 starts toggling of the first internal clock signal ICLK2. The self-refresh signal generation unit 20 deactivates the internal self-refresh signal SREF to a logic low level in response to the toggling of the first internal clock signal ICLK2, and thus, the second clock buffer enable signal CLKBUF2_EN is activated to a logic high level. Accordingly, the second clock buffer 28 starts toggling of the second internal clock signal CVR_CLK2.

FIG. 4 is a timing diagram depicting a case where the internal operation of the semiconductor memory device is not in an idle state after a self-refresh control operation is completed.

Referring to FIG. 4, when the self-refresh start command signal SREF_CMD is input, the first clock buffer 14 stops a toggling of the first internal clock signal ICLK2 and the second clock buffer 28 stops a toggling of the second internal clock signal CVR_CLK2, as described in FIG. 3.

After the internal self-refresh operation is performed, the self-refresh exit command signal EXIT_CMD is input. In response to the self-refresh exit command signal EXIT_CMD, the clock enable signal CKE is activated to a logic high level and the valid self-refresh operation signal SREF_FASTB is deactivated to a logic high level. At this time, the idle signal IDLE maintains a logic low level since at least one bank is activated. In response to the high-level valid self-refresh operation signal SREF_FASTB, the first clock buffer enable signal CLKBUF1_EN is activated to a logic high level, and thus the first clock buffer 14 starts toggling of the first internal clock signal ICLK2. However, the self-refresh signal generation unit 20 maintains the internal self-refresh signal SREF at a logic high level until the idle signal IDLE is activated to a logic high level. When the idle signal IDLE transitions to a logic high level, the self-refresh signal generation unit 20 deactivates the internal self-refresh signal SREF to a logic low level in response to the toggling of the first internal clock signal ICLK2. As a result, the second clock buffer enable signal CLKBUF2_EN is activated to a logic high level, and the second clock buffer 28 starts toggling of the second internal clock signal CVR_CLK2.

Such a conventional clock control circuit requires two clock buffers in order to generate the necessary clock signals. Therefore, the two clock buffers must maintain the toggling operation state in almost all states, causing an undesirable current consumption.

SUMMARY OF THE INVENTION

Exemplary embodiments of the present invention are directed to a semiconductor memory device including a clock control circuit which controls clock signals to thereby prevent power consumption caused by the toggling of clock signals.

Exemplary embodiments of the present invention are also directed to a method for operating a semiconductor memory device including a clock control circuit which controls clock signals to thereby prevent power consumption caused by the toggling of clock signals.

In accordance with an exemplary embodiment of the present invention, a semiconductor memory device includes a first clock buffer configured to toggle a first clock signal when a self-refresh exit command signal is inputted during a self-refresh operation; and a second clock buffer configured to toggle a second clock signal when the self-refresh operation is finished, the second clock being provided to internal circuits.

In accordance with another exemplary embodiment of the present invention, a semiconductor memory device includes a first clock buffer configured to toggle a first clock signal from an input timing of a self-refresh exit command signal up to a timing when an internal self-refresh operation, which is controlled according to the self-refresh exit command signal, is finished, a self-refresh signal generation unit configured to generate a self-refresh signal which is activated in response to a self-refresh start command signal, and deactivated in response to the first clock signal, a second clock buffer configured to toggle a second clock signal in response to the self-refresh signal, and a plurality of internal circuits configured to use the second clock signal.

In accordance with yet another exemplary embodiment of the present invention, a semiconductor memory device includes a first enable control unit configured to generate a first clock enable signal which is activated from an input timing of a self-refresh exit command signal until an internal self-refresh operation is finished, a first clock buffer configured to toggle a first clock signal in response to the first clock enable signal, the first clock signal being used in a self-refresh control circuit, a second enable control unit configured to generate a second clock enable signal which is activated after the internal self-refresh operation is finished, and a second clock buffer configured to toggle a second clock signal in response to the second clock enable signal, the second clock signal being used in a plurality of internal circuits.

In accordance with still another exemplary embodiment of the present invention, a method for operating a semiconductor memory device includes generating a first clock signal toggling from an input timing of a self-refresh exit command signal up to a timing when an internal self-refresh operation is finished, generating a self-refresh signal which is activated in response to a self-refresh start command signal, and deactivated in response to the first clock signal, and generating a second clock signal toggling in response to the self-refresh signal, the second clock signal being used in a plurality of internal circuits.

DESCRIPTION OF SPECIFIC EMBODIMENTS

Figure 1:
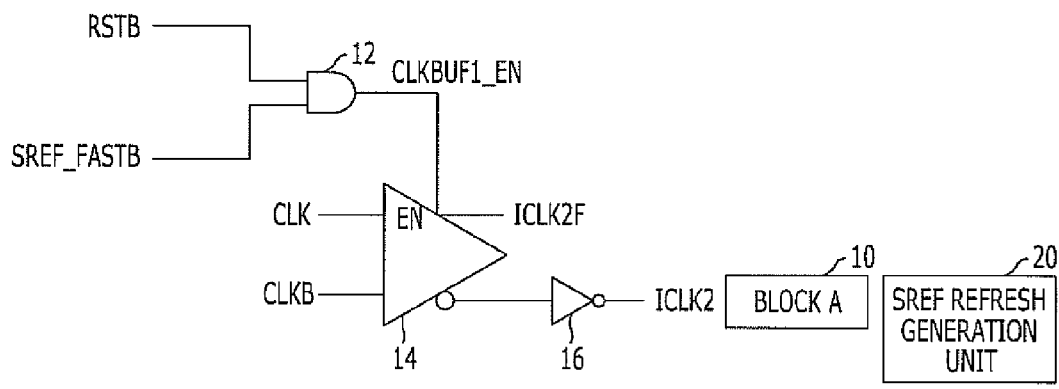
FIGS. 1 and 2 are diagrams of a known clock control circuit.
Figure 2:
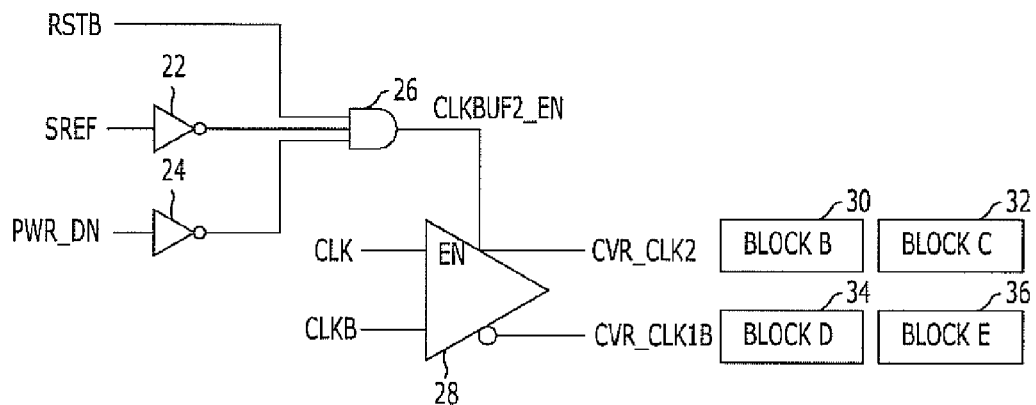
Figure 3:
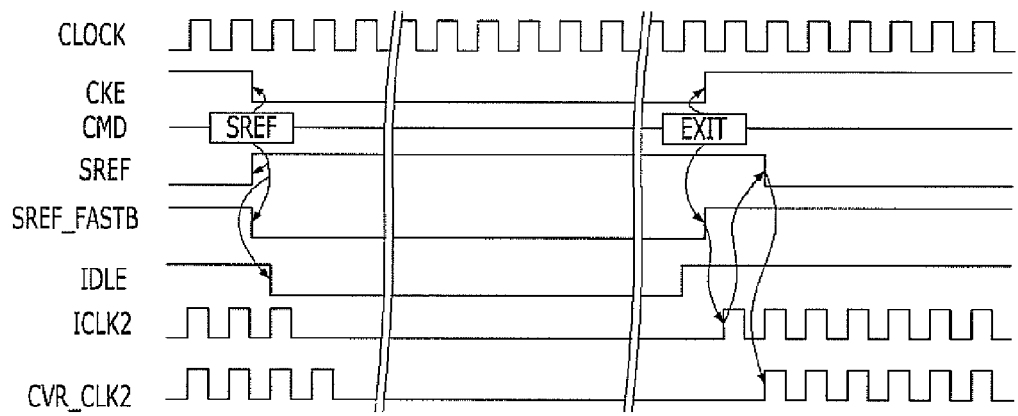
FIG. 3 is a timing diagram depicting a case where an internal operation of a semiconductor memory device is in an idle state after a self-refresh control operation is completed.
Figure 4:
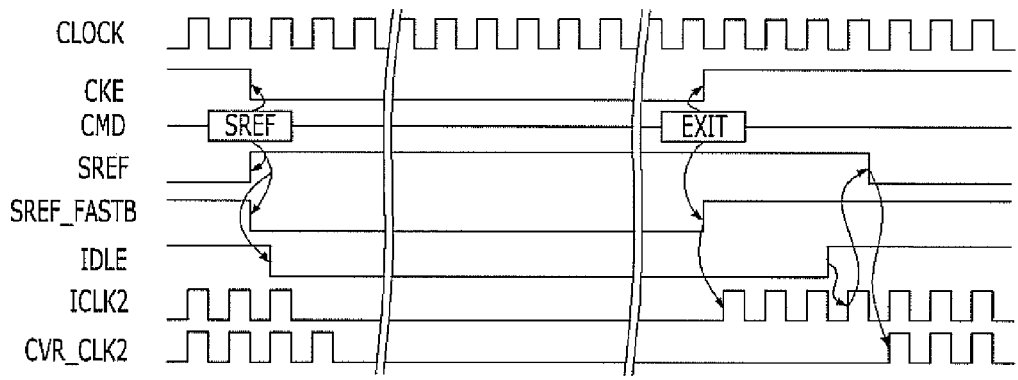
FIG. 4 is a timing diagram depicting a case where an internal operation of a semiconductor memory device is not in an idle state after a self-refresh control operation is completed.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 5:
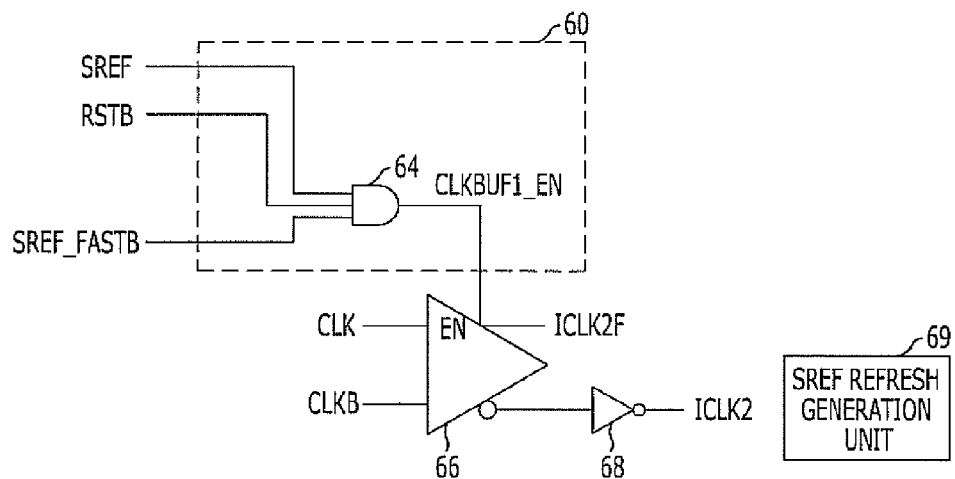
FIGS. 5 and 6 are diagrams of a clock control circuit in accordance with an exemplary embodiment of the present invention.
Figure 6:
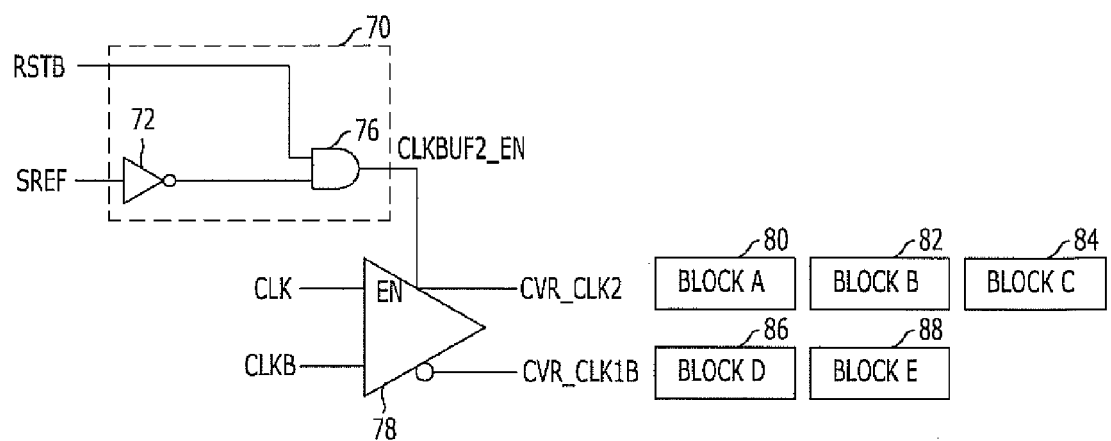

FIGS. 5 and 6 are diagrams of a clock control circuit in accordance with an exemplary embodiment of the present invention.

As shown, the clock control circuit in accordance with an exemplary embodiment of the present invention includes a first clock buffer 66 of FIG. 5 and a second clock buffer 78 of FIG. 6. When a first clock buffer enable signal CLKBUF1_EN becomes a logic high level, the first clock buffer 66 converts clock signals CLK and CLKB to generate first internal clock signals ICLK2 and ICLK2F. Further, when a second clock buffer enable signal CLKBUF2_EN becomes a logic high level, the second clock buffer 78 converts the clock signals CLK and CLKB to generate second internal clock signals CVR_CLK2 and CVR_CLK1B.

The first clock buffer 66 is enabled when an internal self-refresh signal SREF, a valid self-refresh operation signal SREF_FASTB, and an inverted external reset signal RSTB are at a logic high level. Here, the valid self-refresh operation signal SREF_FASTB is activated in response to an input timing of an external self-refresh start command signal SREF_CMD, and deactivated in response to an input timing of an external self-refresh exit command signal EXIT_CMD.

To this end, a first enable control unit 60 comprises an AND gate 64 and is configured to generate the first clock buffer enable signal CLKBUF1_EN based on the internal self-refresh signal SREF, the valid self-refresh operation signal SREF_FASTB, and the inverted external reset signal RSTB.

The first clock buffer 66 generates the first internal clock signals ICLK2F and ICLK2 by converting the clock signals CLK and CLKB in response to the high-level first clock buffer enable signal CLKBUF1_EN. In response to a toggling of the first internal clock signals ICLK2F and ICLK2, a self-refresh signal generation unit 69 deactivates the internal self-refresh signal SREF to a logic low level. Further, in response to the low-level internal self-refresh signal SREF, the first clock buffer 66 is disabled again. Accordingly, the first clock buffer 66 is controlled to be activated/deactivated in response to the first clock buffer enable signal CLKBUF1_EN output from the first enable control unit 60, and outputs the first internal clock signal ICLK2 via an inverter 68.

Meanwhile, the second clock buffer 78 is enabled when the inverted external reset signal RSTB and the internal self-refresh signal SREF are at a logic high level.

To this end, a second enable control unit 70 comprises an inverter 72 and an AND gate 76 and is configured to generate the second clock buffer enable signal CLKBUF2_EN based on the inverted external reset signal RSTB and an inversion of the internal self-refresh signal SREF. The inverter 72 inverts the internal self-refresh signal SREF, and the AND gate 76 performs an AND operation on an output of the inverter 72 and the inverted external reset signal RSTB. Accordingly, the second clock buffer 78 generates the second internal clock signals CVR_CLK2 and CVR_CLK1B by converting the clock signals CLK and CLKB in response to the high-level second clock buffer enable signal CLKBUF2_EN.

In accordance with an exemplary embodiment of the present invention, only the self-refresh signal generation unit 69 is configured to use the first internal clock signals ICLK2F and ICLK2, while all internal circuits 80 to 88 are configured to use the second internal clock signals CVR_CLK2 and CVR_CLK1B. That is, the clock control circuit controls the first and second clock buffers 66 and 78 to toggle the first internal clock signals ICLK2F and ICLK2 at different times than the second internal clock signals CVR_CLK2 and CVR_CLK1B. Here, most internal circuits 80 to 88 use the second internal clock signals CVR_CLK2 and CVR_CLK1B, which continuously toggle except during the self-refresh period. Therefore, in accordance with an exemplary embodiment of the present invention, power consumption occurring due to an overlap of toggling operations of two clock signals may be reduced.

Figure 7:
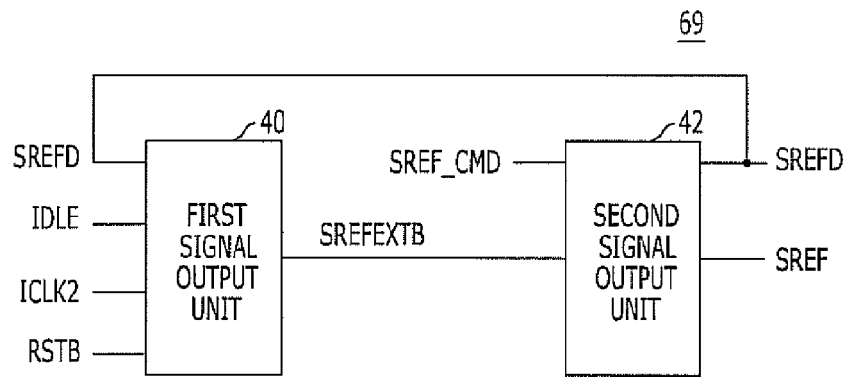
FIG. 7 is a diagram of a self-refresh signal generation unit in accordance with an exemplary embodiment of the present invention.
Figure 8:
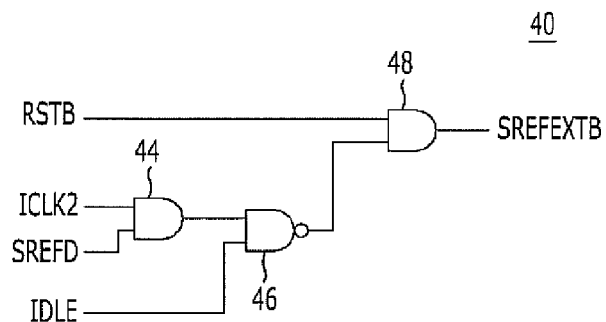
FIG. 8 is a circuit diagram of a first signal output unit illustrated in FIG. 7.
Figure 9:
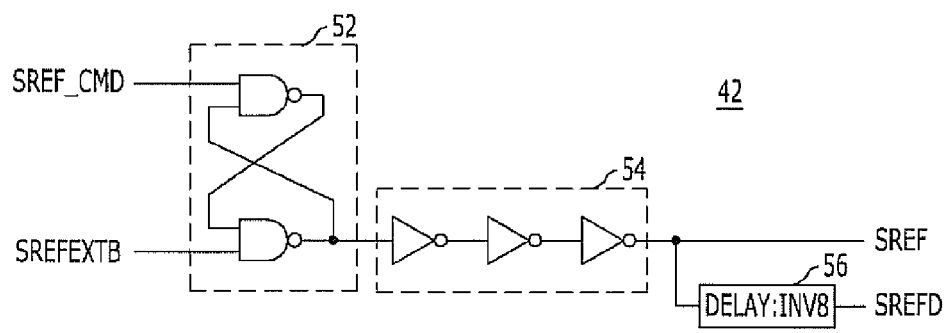
FIG. 9 is a circuit diagram of a second signal output unit illustrated in FIG. 7.

FIG. 7 is a diagram of the self-refresh signal generation unit 69 in accordance with an exemplary embodiment of the present invention. FIGS. 8 and 9 are circuit diagrams of a first signal output unit 40 and a second signal output unit 42 illustrated in FIG. 7, respectively. Here, the self-refresh signal generation unit 69 generates the internal self-refresh signal SREF to control operations of the first and second clock buffers 66 and 78 and to control an internal self-refresh operation.

Referring to FIG. 7, the self-refresh signal generation unit 69 comprises the first and second signal output units 40 and 42. The first signal output unit 40 generates a self-refresh disable timing determination signal SREFEXTB, which determines a timing to disable the internal self-refresh operation, based on an idle signal IDLE, an inverted external reset signal RSTB, a self-refresh control signal SREFD, and the first internal clock signal ICLK2. The second signal output unit 42 generates the internal self-refresh signal SREF in response to the self-refresh disable timing determination signal SREFEXTB and the external self-refresh start command signal SREF_CMD.

In detail, the first signal output unit 40 activates and outputs the self-refresh disable timing determination signal SREFEXTB at a logic low level when the first internal clock signal ICLK2 is toggling and the idle signal IDLE, the inverted external reset signal RSTB, and the self-refresh control signal SREFD are all at a logic high level. Here, the idle signal IDLE is activated to a logic high level when there are no low-active banks among internal banks of the semiconductor memory device.

Referring to FIG. 8, the first signal output unit 40 comprises first to third logic gates 44, 46, and 48. The first logic gate 44 performs an AND operation on the first internal clock signal ICLK2 and the self-refresh control signal SREFD. The second logic gate 46 performs a NAND operation on an output of the first logic gate 44 and the idle signal IDLE. The third logic gate 48 performs an AND operation on the inverted external reset signal RSTB and an output of the second logic gate 46 to output the self-refresh disable timing determination signal SREFEXTB.

The second signal output unit 42 activates the internal self-refresh signal SREF to a logic high level in response to the external self-refresh start command signal SREF_CMD, and deactivates the internal self-refresh signal SREF to a logic low level in response to the self-refresh disable timing determination signal SREFEXTB.

Referring to FIG. 9, the second signal output unit 42 comprises a latch unit 52, an inverter chain 54, and a delay unit 56. The latch unit 52 comprises two NAND gates to be set/reset in response to the external self-refresh start command signal SREF_CMD and the self-refresh disable timing determination signal SREFEXTB. The inverter chain 54 inverts and delays an output of the latch unit 52 to output the internal self-refresh signal SREF. The delay unit 56 delays the internal self-refresh signal SREF to output the self-refresh control signal SREFD.

Hereinafter, referring to FIGS. 5 to 9, an operation of the clock control circuit of the semiconductor memory device in accordance with an exemplary embodiment of the present invention will be described below.

Figure 10:
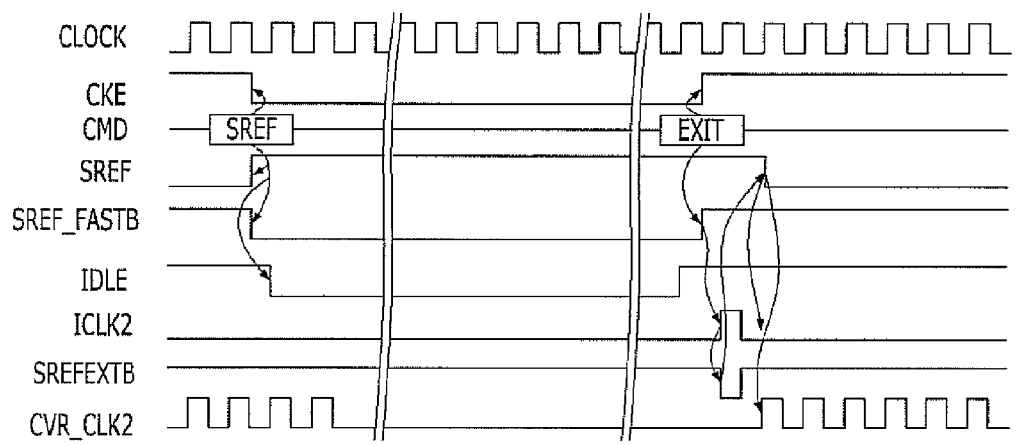
FIG. 10 is a timing diagram depicting a case where an internal operation of a semiconductor memory device is in an idle state after a self-refresh control operation is completed, in accordance with an exemplary embodiment of the present invention.

FIG. 10 is a timing diagram depicting a case where an internal operation of a semiconductor memory device is in an idle state after a self-refresh control operation is completed, in accordance with an exemplary embodiment of the present invention.

Referring to FIG. 10, before the self-refresh start command signal SREF_CMD is input, the internal self-refresh signal SREF is deactivated to a logic low level. The first enable control unit 60 deactivates the first clock buffer enable signal CLKBUF1_EN to a logic low level, and thus the first clock buffer 66 is deactivated so as to stop a toggling of the first internal clock signal ICLK2. Further, since the internal self-refresh signal SREF is deactivated to a logic low level, the second enable control unit 70 activates the second clock buffer enable signal CLKBUF2_EN to a logic high level, and thus the second clock buffer 78 is activated to output the second internal clock signal CVR_CLK2 so that it toggles.

When the self-refresh start command signal SREF_CMD is input, a clock enable signal CKE and the idle signal IDLE are deactivated to a logic low level, the valid self-refresh operation signal SREF_FASTB is activated to a logic low level, and the internal self-refresh signal SREF is activated to a logic high level. At this time, since the second clock buffer enable signal CLKBUF2_EN is deactivated to a logic low level in response to the high-level internal self-refresh signal SREF, the second clock buffer 78 stops a toggling of the second internal clock signal CVR_CLK2. On the other hand, since the valid self-refresh operation signal SREF_FASTB is a logic low level in spite of the high-level internal self-refresh signal SREF, the first clock buffer 66 maintains a deactivation state. As a result, the first internal clock signal ICLK2 still does not toggle.

After an internal self-refresh operation is performed, the self-refresh exit command signal EXIT_CMD is input. In response to the self-refresh exit command signal EXIT_CMD, the clock enable signal CKE is activated to a logic high level and the valid self-refresh operation signal SREF_FASTB is deactivated to a logic high level. At this time, the idle signal IDLE becomes a logic high level since there are no low-active banks among internal banks of the semiconductor memory device. The first enable control unit 60 activates the first clock buffer enable signal CLKBUF1_EN to a logic high level in response to the high-level valid self-refresh operation signal SREF_FASTB and the high-level internal self-refresh signal SREF. As a result, the first clock buffer 66 is activated to start a toggling of the first internal clock signal ICLK2. Accordingly, the first signal output unit 40 activates the self-refresh disable timing determination signal SREFEXTB to a logic low level, and the second signal output unit 42 deactivates the internal self-refresh signal SREF to a logic low level.

In response to the low-level internal self-refresh signal SREF, the first clock buffer enable signal CLKBUF1_EN is deactivated to a logic low level while the second clock buffer enable signal CLKBUF2_EN is activated to a logic high level. As a result, the first clock buffer 66 stops the toggling of the first internal clock signal ICLK2, while the second clock buffer 78 starts a toggling of the second internal clock signal CVR_CLK2.

Figure 11:
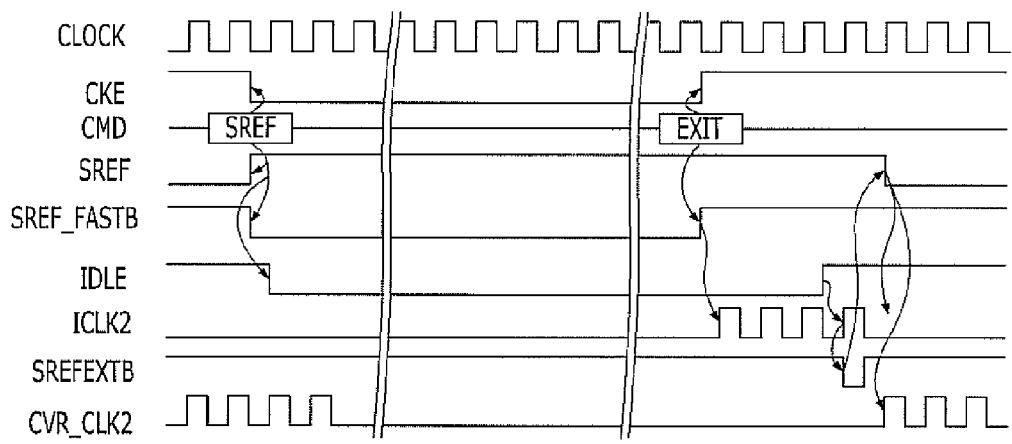
FIG. 11 is a timing diagram depicting a case where an internal operation of a semiconductor memory device is not in an idle state after a self-refresh control operation is completed, in accordance with an exemplary embodiment of the present invention.

FIG. 11 is a timing diagram depicting a case where an internal operation of a semiconductor memory device is not in an idle state after a self-refresh control operation is completed, in accordance with an exemplary embodiment of the present invention.

Referring to FIG. 11, before the self-refresh start command signal SREF_CMD is input, in response to the low-level internal self-refresh signal SREF, the first clock buffer 66 is deactivated so as to stop a toggling of the first internal clock signal ICLK2. However, the second clock buffer 78 is activated to output the second internal clock signal CVR_CLK2 so that it toggles.

When the self-refresh start command signal SREF_CMD is input, the clock enable signal CKE and the idle signal IDLE are deactivated to a logic low level, the valid self-refresh operation signal SREF_FASTB is activated to a logic low level, and the internal self-refresh signal SREF is activated to a logic high level. At this time, since the second clock buffer enable signal CLKBUF2_EN is deactivated in response to the high-level internal self-refresh signal SREF, the second clock buffer 78 stops the toggling of the second internal clock signal CVR_CLK2. On the other hand, since the valid self-refresh operation signal SREF_FASTB is a logic low level in spite of the high-level internal self-refresh signal SREF, the first clock buffer 66 maintains a deactivation state. As a result, the first internal clock signal ICLK2 still does not toggle.

After an internal self-refresh operation is performed, the self-refresh exit command signal EXIT_CMD is input. In response to the self-refresh exit command signal EXIT_CMD, the clock enable signal CKE is activated to a logic high level and the valid self-refresh operation signal SREF_FASTB is deactivated to a logic high level. At this time, the idle signal IDLE maintains a logic low level since at least one bank is activated.

The first enable control unit 60 activates the first clock buffer enable signal CLKBUF1_EN to a logic high level in response to the high-level valid self-refresh operation signal SREF_FASTB and the high-level internal self-refresh signal SREF. As a result, the first clock buffer 66 is activated to start a toggling of the first internal clock signal ICLK2. Since the idle signal IDLE maintains a logic low state, the first signal output unit 40 deactivates the self-refresh disable timing determination signal SREFEXTB to a logic high level regardless of the toggling of the first internal clock signal ICLK2. Thus, the second signal output unit 42 maintains the internal self-refresh signal SREF at a logic high level.

When the idle signal IDLE becomes a logic high level since there are no low-active banks among internal banks of the semiconductor memory device, the first signal output unit 40 activates the self-refresh disable timing determination signal SREFEXTB to a logic low level in response to the toggling of the first internal clock signal ICLK2. The second signal output unit 42 deactivates the internal self-refresh signal SREF to a logic low level in response to the self-refresh disable timing determination signal SREFEXTB.

In response to the low-level internal self-refresh signal SREF, the first clock buffer enable signal CLKBUF1_EN is deactivated to a logic low level while the second clock buffer enable signal CLKBUF2_EN is activated to a logic high level. As a result, the first clock buffer 66 stops the toggling of the first internal clock signal ICLK2 while the second clock buffer 78 starts a toggling of the second internal clock signal CVR_CLK2.

In accordance with the exemplary embodiments of the present invention, a clock control circuit includes a first clock buffer which controls a toggling of a first clock signal during only a self-refresh exit operation, and a second clock buffer which controls toggling of a second clock signal during the other operations. Using these clock buffers, the clock control circuit controls toggling of the first and second clock signals so that they are not toggled at the same time (i.e., so that toggling durations do not overlap). Therefore, power consumption occurring during an operation of toggling the clock signals may be reduced.

The embodiments of the present invention can be applied to circuits and devices which achieve power reduction by appropriately controlling the operation of toggling the clock signals.

While the present invention has been described with respect to the specific embodiments, it will be apparent to those skilled in the art that various changes and modifications may be made without departing from the spirit and scope of the invention as defined in the following claims.

What is claimed is:

1. A clock control circuit comprising:
   a first clock buffer configured to toggle a first clock signal when a self-refresh exit command signal is inputted during a self-refresh operation;
   a second clock buffer configured to toggle a second clock signal when the self-refresh operation is finished, the second clock being provided to internal circuits;
   a first signal output unit configured to generate a self-refresh disable timing determination signal; and
   a second signal output unit configured to generate the self-refresh signal in response to the self-refresh disable timing determination signal.

2. The clock control circuit of claim 1, wherein the first clock buffer starts a toggling of the first clock signal when the self-refresh exit command signal is inputted, and stops the toggling of the first clock signal when the self-refresh operation is finished in response to the self-refresh exit command signal.

3. The clock control circuit of claim 1, wherein the second clock buffer starts a toggling of the second clock signal in response to a signal generated based on the first clock signal outputted from the first clock buffer.

4. The clock control circuit of claim 1, further comprising:
   a first enable control unit configured to generate a first clock buffer enable signal for controlling the first clock buffer based on the self-refresh exit command signal and a self-refresh signal; and
   a second enable control unit configured to generate a second clock buffer enable signal for controlling the second clock buffer based on an inverted signal of the self-refresh signal.

5. A semiconductor memory device comprising:
   a first clock buffer configured to toggle a first clock signal from an input timing of a self-refresh exit command signal up to a timing when an internal self-refresh operation, which is controlled according to the self-refresh exit command signal, is finished;
   a self-refresh signal generation unit configured to generate a self-refresh signal which is activated in response to a self-refresh start command signal, and deactivated in response to the first clock signal;
   a second clock buffer configured to toggle a second clock signal in response to the self-refresh signal; and
   a plurality of internal circuits configured to use the second clock signal.

6. The semiconductor memory device of claim 5, wherein the second clock buffer toggles the second clock signal in response to a deactivation of the self-refresh signal.

7. The semiconductor memory device of claim 5, wherein the self-refresh signal generation unit comprises:
   a first signal output unit configured to generate a self-refresh disable timing determination signal, which determines a timing to finish the internal self-refresh operation, based on an idle signal, a delay signal of the self-refresh signal, and the first clock signal; and
   a second signal output unit configured to generate the self-refresh signal in response to the self-refresh disable timing determination signal and the self-refresh start command signal.

8. The semiconductor memory device of claim 7, wherein the first signal output unit activates the self-refresh disable timing determination signal when the first clock signal is toggling and the idle signal and the delay signal of the self-refresh signal are activated, the idle signal being activated when there are no low-active banks among internal banks of the semiconductor memory device.

9. The semiconductor memory device of claim 7, wherein the first signal output unit comprises:
   a first logic gate configured to perform an AND operation on the first clock signal and the delay signal of the self-refresh signal; and
   a second logic gate configured to perform a NAND operation on an output of the first logic gate and the idle signal to output the self-refresh disable timing determination signal.

10. The semiconductor memory device of claim 7, wherein the second signal output unit activates the self-refresh signal in response to the self-refresh start command signal, and deactivates the self-refresh signal in response to the self-refresh disable timing determination signal.

11. The semiconductor memory device of claim 7, wherein the second signal output unit comprises:
   an RS latch unit configured to be set/reset in response to the self-refresh start command signal and the self-refresh disable timing determination signal;
   an inverter chain configured to invert and delay an output of the RS latch unit to output the self-refresh signal; and
   a delay unit configured to delay the self-refresh signal to output the delay signal of the self-refresh signal.

12. A semiconductor memory device comprising:
   a first enable control unit configured to generate a first clock enable signal which is activated from an input timing of a self-refresh exit command signal until an internal self-refresh operation is finished;
   a first clock buffer configured to toggle a first clock signal in response to the first clock enable signal, the first clock signal being used in a self-refresh control circuit;
   a second enable control unit configured to generate a second clock enable signal which is activated after the internal self-refresh operation is finished; and
   a second clock buffer configured to toggle a second clock signal in response to the second clock enable signal, the second clock signal being used in a plurality of internal circuits.

13. The semiconductor memory device of claim 12, wherein the second enable control unit generates the second clock enable signal in response to a self-refresh signal generated by the self-refresh control circuit.

14. The semiconductor memory device of claim 13, wherein the self-refresh control circuit comprises:
   a first signal output unit configured to generate a self-refresh disable timing determination signal, which determines a timing to finish the internal self-refresh operation, based on a delay signal of the self-refresh signal and the first clock signal; and
   a second signal output unit configured to generate the self-refresh signal in response to the self-refresh disable timing determination signal and the self-refresh start command signal.

15. A method for operating a semiconductor memory device, the method comprising:
- generating a first clock signal toggling from an input timing of a self-refresh exit command signal up to a timing when an internal self-refresh operation is finished;
- generating a self-refresh signal which is activated in response to a self-refresh start command signal, and deactivated in response to the first clock signal; and
- generating a second clock signal toggling in response to the self-refresh signal, the second clock signal being used in a plurality of internal circuits.

16. The method of claim 15, wherein the generating of the second clock signal comprises toggling the second clock signal in response to a deactivation of the self-refresh signal.

17. The method of claim 15, wherein the generating of the self-refresh signal comprises:
- generating a self-refresh disable timing determination signal, which determines a timing to finish the internal self-refresh operation, based on an idle signal, a delay signal of the self-refresh signal, and the first clock signal; and
- generating the self-refresh signal in response to the self-refresh disable timing determination signal and the self-refresh start command signal.

18. The method of claim 17, wherein the generating of the self-refresh disable timing determination signal comprises:
- activating the self-refresh disable timing determination signal when the first clock signal is toggling and the idle signal and the delay signal of the self-refresh signal are activated, the idle signal being activated when there are no low-active banks among internal banks of the semiconductor memory device.

19. The method of claim 17, wherein the generating of the self-refresh signal comprises:
- activating the self-refresh signal in response to the self-refresh start command signal, and deactivating the self-refresh signal in response to the self-refresh disable timing determination signal.

* * * * *